(12) United States Patent
Watanabe et al.

(10) Patent No.: US 6,346,762 B2
(45) Date of Patent: Feb. 12, 2002

(54) PIEZOELECTRIC TRANSFORMER (75) Inventors: Yoshiyuki Watanabe; Hiroshi Kishi; Yasuyuki Inomata; Shigeo Ishii, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/823,551

(22) Filed: Mar. 30, 2001

(30) Foreign Application Priority Data

Mar. 30, 2000 (JP) ......................................... 2000-095797

(51) Int. Cl.⁷ ............................................. H01L 41/08

(52) U.S. Cl. ......................... 310/328; 310/365; 310/366

(58) Field of Search ................................. 310/328, 358, 310/359, 365, 366

(56) References Cited

U.S. PATENT DOCUMENTS 5,237,239 A * 8/1993 Inoue et al. ................. 310/328
5,266,862 A * 11/1993 Ohya .......................... 310/328
5,877,581 A * 3/1999 Inoi et al. .................... 310/358

* cited by examiner

Primary Examiner—Mark O. Budd
(74) Attorney, Agent, or Firm—Rosenman & Colin, LLP.

(57) ABSTRACT

The piezoelectric transformer obtains large output powers by way of reducing the heat generation. The piezoelectric transformer includes one or more input parts and an output part. Each of the input parts is formed of alternately stacked piezoelectric sheets and internal electrodes. Each piezoelectric sheet has a first region on which the internal electrode is formed and a second region on which no internal electrode is formed. Each of the input parts includes means for reducing stress concentration around boundary regions between the first and the second regions.

8 Claims, 7 Drawing Sheets

PIEZOELECTRIC TRANSFORMER

FIELD OF THE INVENTION

The present invention relates to a piezoelectric transformer; and, more particularly, to a laminated piezoelectric transformer for use in such power sources as converters and inverters.

BACKGROUND OF THE INVENTION

Piezoelectric transformers feature smaller sizes and easily obtainable higher efficiencies than conventional electromagnetic transformers. For such reasons, piezoelectric transformers are gaining popularity as step-up transformers, e.g., backlight power sources of liquid crystal display (LCD) monitors. However, step-down transformers are more frequently used in power supplies than step-up transformers.

It is preferable that a piezoelectric transformer have such characteristics as high output power, less heat generation, small size and higher efficiency. However, increasing the output power of a conventional piezoelectric transformer gives rise to the increased heat generation, which in turn reduces the output thereof.

Output power of a piezoelectric transformer is basically determined by a mechanical vibration velocity thereof. In order to obtain a high mechanical vibration velocity, it is preferable to construct an input (driving) part of a piezoelectric transformer to have a configuration capable of generating a large vibration.

Generation of large vibration can be achieved by constructing the electrodes in a laminated structure or by increasing the area of the electrodes. However, large vibrations in a piezoelectric transformer cause an increase in crystallographic and electric losses, resulting in an increased heat generation which in turn reduces the output power of the piezoelectric transformer.

SUMMARY OF THE INVENTION

It is, therefore, an object of the present invention to provide a piezoelectric transformer capable of obtaining large output powers by way of reducing the heat generation.

In accordance with the present invention, there is provided a piezoelectric transformer including: one or more input parts; and an output part, wherein each of the input parts is formed of alternately stacked piezoelectric sheets and internal electrodes and each piezoelectric sheet has a first region on which the internal electrode is formed and a second region on which no internal electrode is formed, and wherein each of the input parts includes means for reducing stress concentration around boundary regions between the first and the second regions.

BRIEF DESCRIPTION OF DRAWINGS

The above and other objects and features of the present invention will become apparent from the following description of preferred embodiments with conjunction to the accompanying drawings in which.

DETAILED DESCRIPTION OF THE PREFERRED EMBODIMENT

It has been known that heat generation in a piezoelectric transformer mainly occurs at the input (driving) part thereof. The inventors of the present invention have therefore conducted experiments to investigate the heat generation mechanism and found that most of the heat is generated at the boundary regions of the electrodes of the input part, where the deformed regions under the electrodes are in contact with the undeformed regions therearound. Stresses are concentrated at the boundary between the deformed and the undeformed regions and, therefore, a large amount of heat is generated due to mechanical friction taking place thereat. It has been also found that heat generation at the boundary regions is mainly determined by the mechanical factor, i.e., stress, rather than other factors, e.g., crystalline structure. Accordingly, high efficient piezoelectric transformers can be obtained by restraining the heat generation by way of reducing the stress concentration at the boundary regions.

Figure 1:
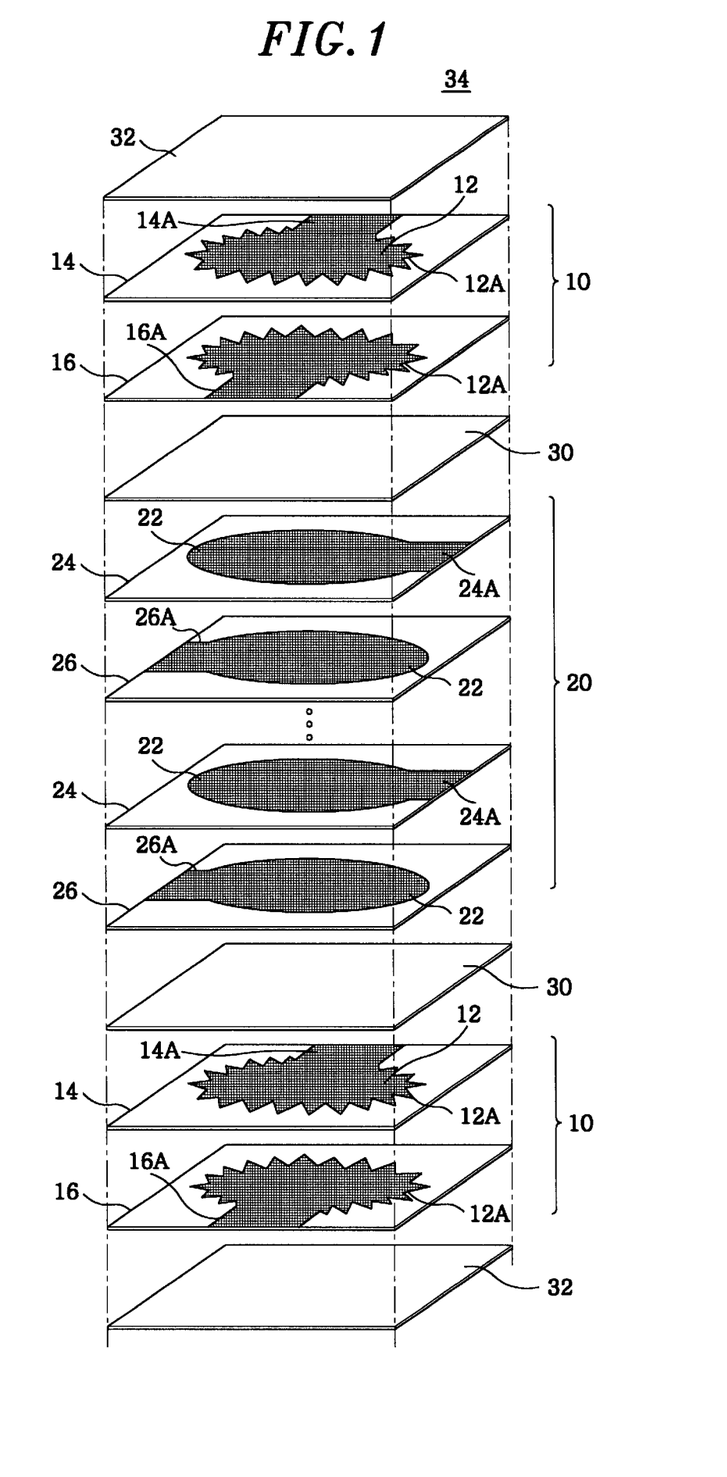
FIG. 1 is a fragmentary perspective view setting forth a laminated body incorporated in a piezoelectric transformer in accordance with a first embodiment of the present invention.

A first preferred embodiment of the present invention will now be described with reference to FIGS. 1 to 4. In a fabrication of a piezoelectric transformer in accordance with the first preferred embodiment of the present invention, a laminated body 34 is formed as shown in FIG. 1, the laminated body 34 being provided with an output (power generating) part 20 disposed between two input (driving) parts 10.

Each of the input parts 10 includes two laminated piezoelectric sheets 14, 16 each having an internal electrode 12 at the center of a top surface thereof. The overall shape of each internal electrode 12 is circular, but there is provided at the periphery of each internal electrode 12 a stress-relieving pattern 12A having a saw-toothed shape. The laminated body 34 is preferably formed such that the peripheries of the internal electrodes 12 on the sheets 14, 16 do not completely overlap with each other when viewed from the top. Specifically, two stress-relieving patterns 12A on the sheets 14 and 16 are formed to have different shapes or if the stress-relieving patterns 12A have the identical shape, two internal electrodes are disposed on the sheets 14 and 16 such that they are rotated and/or shifted from one another in order for the stress-relieving patterns 12A not to completely overlap with each other.

The internal electrodes 12 formed on the laminated piezoelectric sheets 14, 16 include terminals 14A and 16A extending toward the backside and the front side of the laminated body 34, respectively. In other words, the terminals 14A and 16A of the neighboring internal electrodes 12 extend along the backward and forward direction from the internal electrodes 12.

The output (power generating) part 20 includes, e.g., six pairs of laminated piezoelectric sheets 24 and 26, each of laminated piezoelectric sheets 24 and 26 having an internal electrode 22 at the substantial center of a top surface thereof. The internal electrodes 22 formed on the pair of laminated piezoelectric sheets 24 and 26 include terminals 24A and 26A extending toward the light side and the left side of the laminated body 34, respectively. In other words, the terminals 24A and 26A of the neighboring internal electrodes 22, respectively, extend along the right and the left directions from the internal electrodes 22.

The laminated body 34 further includes two insulation bare sheets 30 for separating the upper and the lower input parts 10 from the output part 20, the insulation bare sheets 30 having no electrodes thereon being disposed between the input parts 10 and the output part 20. The laminated body 34 is further provided with two protective insulation sheets 32 disposed on top and under bottom thereof. Piezoelectric, e.g., PZT, green sheets are used for the sheets 14, 16, 24, 26. Additionally, the internal electrodes 12, 22 and the terminals 14A, 16A, 24A and 26A are formed of, e.g., an Ag or Pd alloy.

Figure 2:
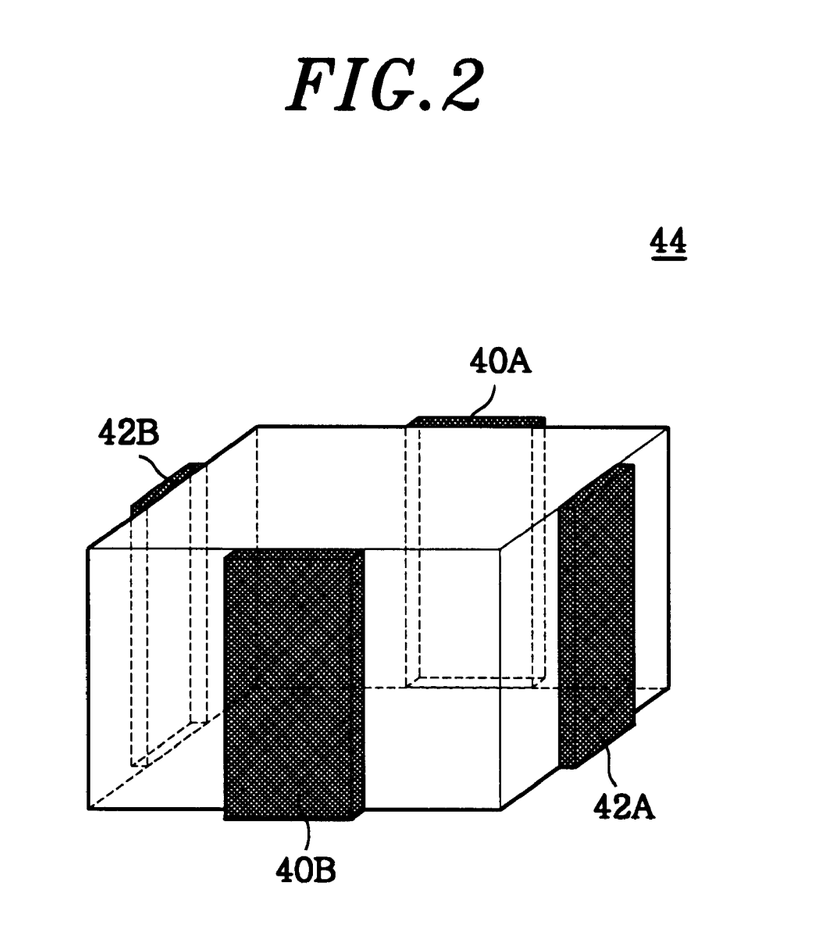
FIG. 2 shows a perspective view illustrating the piezoelectric transformer in accordance with a first embodiment of the present invention.

All the sheets constituting the piezoelectric transformer are compressed after being stacked as shown in FIG. 1. Thereafter, a binder removing and sintering process are performed and then external electrodes 40A, 40B, 42A and 42B are formed on the sintered body as shown in FIG. 2. In this example, the terminals 14A of the input parts 10 are connected to an external electrode 40A and the terminals 16A thereof are connected to an external electrode 40B as illustrated in FIG. 2. The terminals 24A of the output part 20 are connected to an external electrode 42A and the terminals 26A thereof are connected to an external electrode 42B. The external electrodes 40A, 40B, 42A and 42B are formed of a conductive material, e.g., Ag. Next, a poling of the sintered body is performed through the use of external electrodes formed thereon. For instance, the poling of the sintered body is achieved by applying an electric field of 2 KV/mm between the external electrodes 40A and 40B and between 42A and 42B at 100° C. for 10 min, thereby obtaining a piezoelectric transformer 44.

Figure 3A:
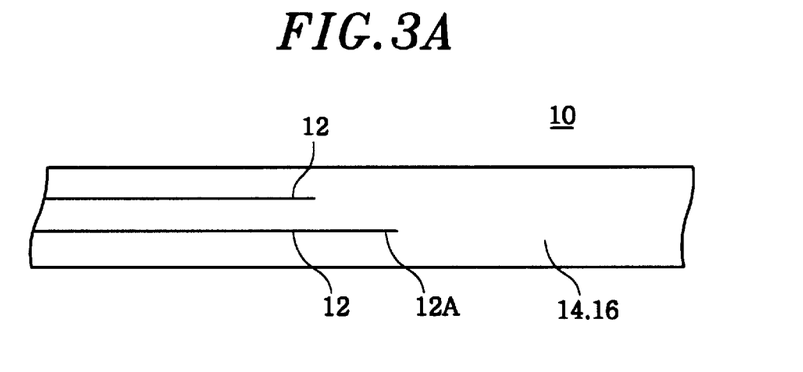
FIG. 3A offers a schematic sectional view depicting a input part in the piezoelectric transformer shown in FIG. 1, with other portions omitted.
Figure 3B:
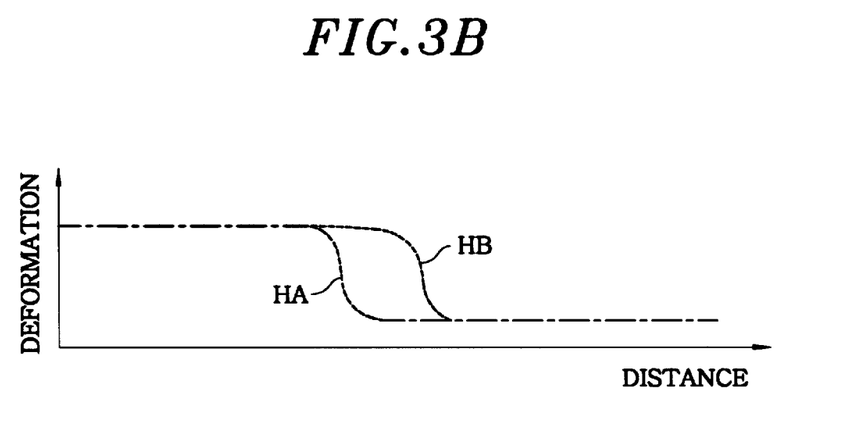
FIGS. 3B and 3C provide graphs as in FIG. 3A portraying a displacement of the piezoelectric transformer.
Figure 3C:
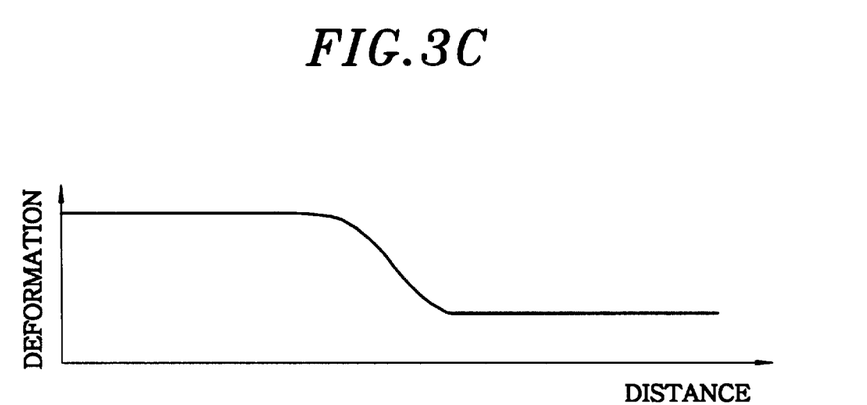
Figure 3D:
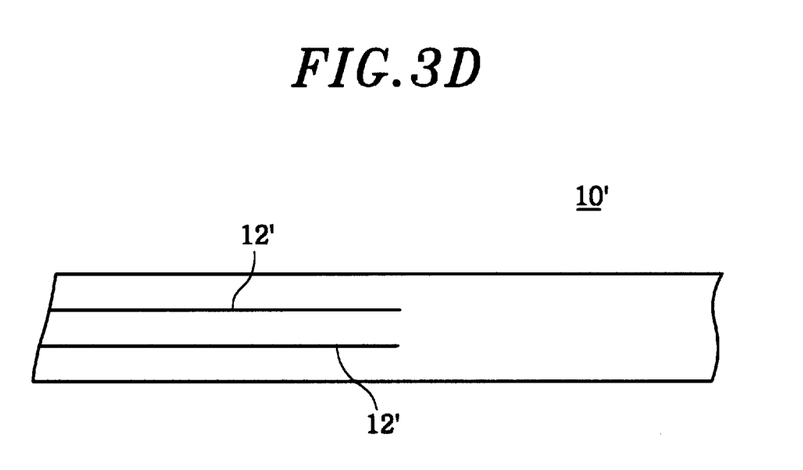
FIG. 3D represents a schematic sectional view similar to that of FIG. 3A and depicting a input part of a comparative piezoelectric transformer.
Figure 3E:
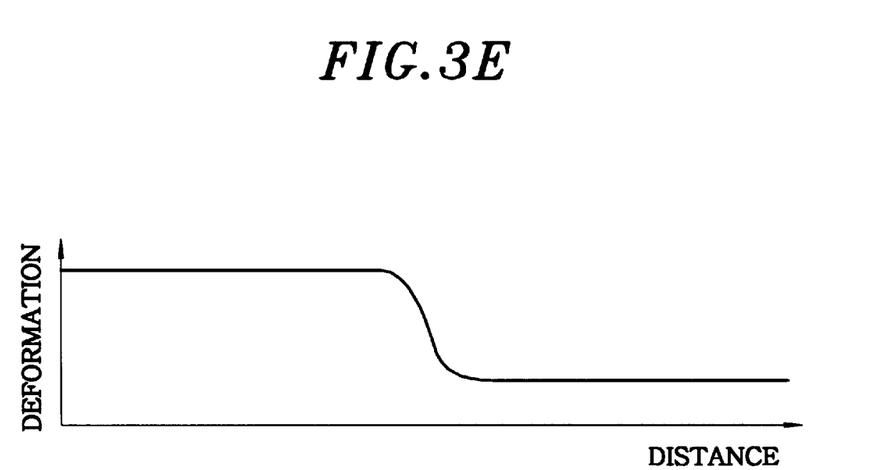
FIG. 3E presents a graph as in FIG. 3D delineating a displacement of the comparative piezoelectric transformer.

Thereafter, the piezoelectric transformer thus obtained has been compared with comparative samples of conventional piezoelectric transformers having no stress-relieving patterns at the internal electrodes of the input parts. FIGS. 3A and 3D respectively depict schematic cross sectional views of the input part 10 of the piezoelectric transformer 44 in accordance with the first embodiment of the present invention and a input part 10' of a comparative piezoelectric transformer. As described above, the stress-relieving patterns 12A of the internal electrodes 12 of the input part 10 are provided with irregular edges not completely overlapping with each other. If there exists non-overlapping regions at the edges of the internal electrodes 12 as shown in FIG. 3A, deformation in the piezoelectric sheets due to the upper and the lower electrodes 12 will occur along the lines HA and HB as shown in FIG. 3B. The overall deformation of the piezoelectric sheet due to the internal electrodes 12 of FIG. 3A then will be the average of the deformation along the curves HA and HB, having less steep transition of deformation as shown in FIG. 3C. Therefore, stress will be distributed in wider regions around the periphery of the internal electrodes 12. On the other hand, since the internal electrodes 12' of the input part of the conventional piezoelectric transformers are completely overlapped as shown in FIG. 3D, the transition from the deformed region to the non-deformed region sharply occurs as shown in FIG. 3E. In other words, the stress is concentrated around the periphery of the internal electrodes 12'.

Figure 4:
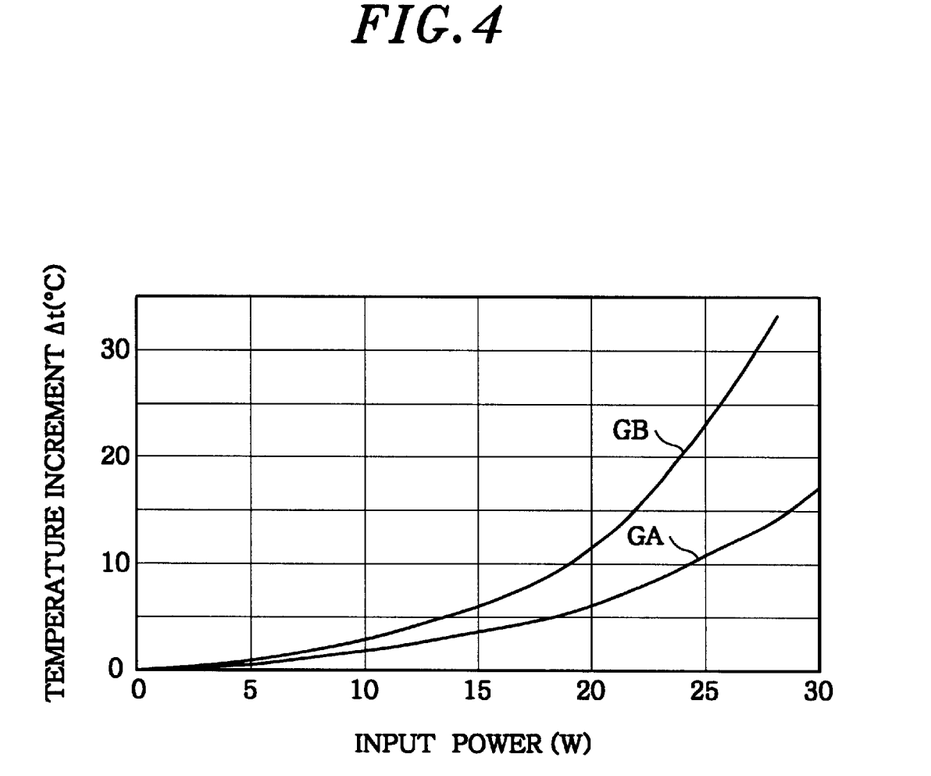
FIG. 4 shows graphs representing temperature increment as a function of an input power in the piezoelectric transformers of FIG. 3A and in the comparative piezoelectric transformer of FIG. 3D.

FIG. 4 shows graphs representing temperature increment as a function of an input power in the piezoelectric transformer of the present invention and the prior art, wherein the horizontal and the vertical axes indicate the input power (W) and the temperature variation [$\Delta t$ (°C.)], respectively. Curves GA and GB correspond to the piezoelectric transformer 44 of the present invention and the comparative sample, respectively. As can be noted from the curves that the temperature increase of the inventive piezoelectric transformer is lower than that of the comparative piezoelectric transformer.

Figure 5:
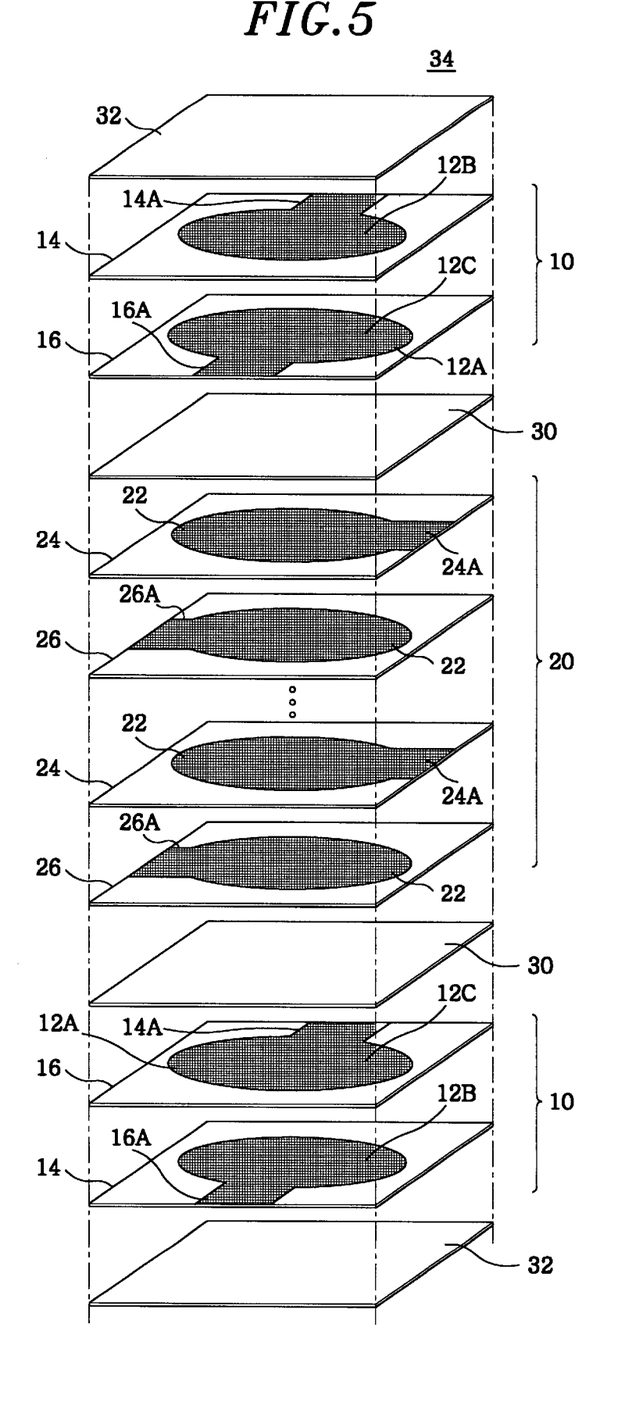
FIG. 5 offers a fragmentary perspective view setting forth a laminated body incorporated in a piezoelectric transformer in accordance with a second embodiment of the present invention.

FIG. 5 describes a laminated body 34 incorporated in a piezoelectric transformer in accordance with a second embodiment of the present invention, wherein like reference numerals designate like parts shown in FIG. 1. In the laminated body 34 of this embodiment, each input part 10 includes two piezoelectric sheets 14, 16 having internal electrodes 12B and 12C disposed on top thereof. The internal electrodes 12B and 12C have different size. For example, the internal electrode 12C is formed to have a diameter larger than that of the internal electrode 12B. As a result, the transition between the deformed and the undeformed regions occurs less steeply and therefore the stress concentration can be ameliorated, resulting in the reduced heat generation.

Figure 6:
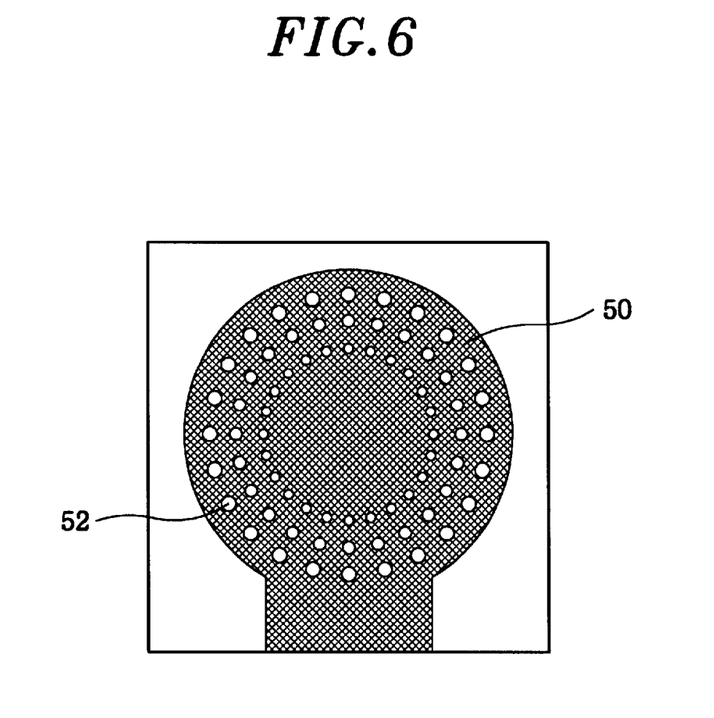
FIG. 6 provides a schematic plan view illustrating an internal electrode in a input part of a piezoelectric transformer in accordance with a third embodiment of the present invention.

FIG. 6 illustrates an internal electrode 50 incorporated in an input part of a piezoelectric transformer in accordance with the third embodiment of the present invention. The internal electrode 50 includes a plurality of openings 52 each of which is arranged to have an enlarged diameter as moving from the center to the periphery of the internal electrodes 50. By arranging the neighbor internal electrodes 50, the openings 52 of the electrodes 50 do not completely overlap with each other, in such a way that the heat generation can be effectively reduced as in the first and the second embodiments of the present invention.

Figure 7:
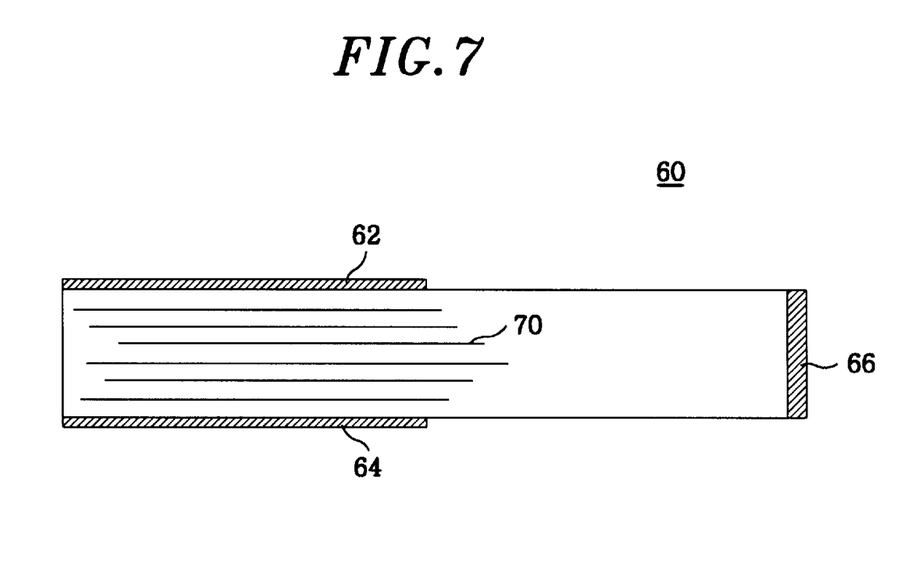
FIG. 7 represents a schematic cross sectional view depicting a Rosen-type piezoelectric transformer in accordance with a fourth embodiment of the present invention.

Referring to FIG. 7, there is illustrated a Rosen-type piezoelectric transformer 60 in accordance with a fourth embodiment of the present invention, wherein the piezoelectric transformer 60 includes an input part and an output part at the left and the right hand sides thereof. The input part having two external electrodes 62, 64 are placed at the top and the bottom surfaces thereof, respectively, and a number of internal electrodes 70. The output part having an external electrode 66 formed on a side surface thereof. In the input part, the neighbor internal electrodes are shifted from each other in such a way that they do not completely overlap with each other. As a result reduction of heat generation can be effected as in the previous embodiments.

While the invention has been shown and described with respect to the preferred embodiments, it will be understood by those skilled in the art that various changes and modifications may be made without departing from the spirit and scope of the invention as defined in the following claims.

What is claimed is:

1. A piezoelectric transformer comprising:

one or more input parts; and an output part, wherein each of the input parts is formed of alternately stacked piezoelectric sheets and internal electrodes and each of the piezoelectric sheets has a first region on which each of the internal electrodes is formed and a second region on which no internal electrode is formed, and wherein each of the input parts includes means for reducing stress concentration around boundary regions between the first and the second regions.

2. The piezoelectric transformer of claim 1, wherein the stress-reducing means is non-overlapping portions of two neighboring internal electrodes.

3. The piezoelectric transformer of claim 2, wherein the stress-reducing means is disposed along a periphery of each of the internal electrodes.

4. The piezoelectric transformer of claim 3, wherein the periphery of each of the neighboring internal electrodes is different from that of the neighboring internal electrodes.

5. The piezoelectric transformer of claim 3, wherein the peripheries of the neighboring internal electrodes have an identical shape and the neighboring internal electrodes are shifted from each other.

6. The piezoelectric transformer of claim 3, wherein the neighboring internal electrodes have an identical shape but with different size.

7. The piezoelectric transformer of claim 2, wherein each of the internal electrodes in the input part include a plurality of openings, the neighboring internal electrodes being disposed for the openings thereof not to completely overlap with each other.

8. The piezoelectric transformer of claims 1, wherein the piezoelectric transformer is a Rosen-type piezoelectric transformer.

* * * * *